United States Patent
Kamiya

(10) Patent No.: US 7,391,279 B2
(45) Date of Patent: Jun. 24, 2008

(54) INVERTING AMPLIFIER AND CRYSTAL OSCILLATOR HAVING SAME

(75) Inventor: Masaaki Kamiya, Tokyo (JP)

(73) Assignee: Interchip Corporation, Tokyo (JP)

( * ) Notice: Subject to any disclaimer, the term of this patent is extended or adjusted under 35 U.S.C. 154(b) by 64 days.

(21) Appl. No.: 11/430,952

(22) Filed: May 10, 2006

(65) Prior Publication Data

US 2006/0255871 A1    Nov. 16, 2006

(30) Foreign Application Priority Data

May 11, 2005    (JP)    ............................. 2005-138970

(51) Int. Cl.
*H03B 5/32* (2006.01)

(52) U.S. Cl. .................... 331/158; 330/296; 331/116 R; 331/116 FE

(58) Field of Classification Search ................. 331/158, 331/116 R, 116 FE; 330/296
See application file for complete search history.

(56) References Cited

U.S. PATENT DOCUMENTS 3,725,822 A * 4/1973 Eaton, Jr. ................ 331/108 B

FOREIGN PATENT DOCUMENTS

JP    2004-096711 A    3/2004

* cited by examiner

*Primary Examiner*—Arnold Kinkead
(74) *Attorney, Agent, or Firm*—The Webb Law Firm, P.C.

(57) ABSTRACT

A bypass capacitance is connected to a node between first and second self-bias resistances connected in series between an input and an output of an inverter. The bypass capacitance accommodates changes in the output voltage of the inverter to suppress the feedback effect from the output side to the input side of the inverter. That is, the bypass capacitance plays the role of suppressing a decrease in the input impedance by the Miller effect.

15 Claims, 7 Drawing Sheets

PRIOR ART

PRIOR ART $V_o = A_v * V_{in}$

PRIOR ART

PRIOR ART

INVERTING AMPLIFIER AND CRYSTAL OSCILLATOR HAVING SAME

The entire disclosure of Japanese Patent Application No. 2005-138970 filed May 11, 2005 is expressly incorporated by reference herein.

BACKGROUND OF THE INVENTION

1. Field of the Invention

This invention relates to an inverting amplifier, and a crystal oscillator having the inverting amplifier. More particularly, the invention relates to those which are useful when applied as an alternating current inverting amplifier for an FET input, an MOS input or a CMOS input requiring a high input impedance, and a crystal oscillator having the AC inverting amplifier.

2. Description of the Related Art

FIG. 8 is a circuit diagram showing an inverting amplifier of a CMOS circuit according to the prior art. As shown in this drawing, this inverting amplifier is composed of a CMOS inverter comprising a P-channel MOS transistor 1 and an N-channel MOS transistor connected in series, and a self-bias resistance Rf connected between an input terminal In and an output terminal Out of the CMOS inverter.

FIG. 9 shows the input voltage and output voltage of the inverting amplifier, and a voltage distribution in the self-bias resistance Rf shown in FIG. 8. In this drawing, the input voltage is designated as Vin, the voltage gain of the CMOS inverter is designated as Av, and the output voltage is designated as Vo. Based on this drawing, a current If flowing through the self-bias resistance Rf is expressed as If=(1+Av)Vin/Rf Thus, the input impedance Zin viewed from the input side is expressed as Zin=Rf/(1+Av)

Consequently, with the CMOS inverter having a great voltage gain Av, the effective input impedance has to be markedly decreased. In the case of the CMOS inverter used at 100 KHz or lower, for example, the voltage gain Av of the CMOS inverter in response to a small signal is 20 or more, so that the input impedance decreases to one-twentieth or less. This phenomenon is generally called the Miller effect.

Normally, the higher the input impedance of the amplifier, the better. If a decrease in the input impedance by the Miller effect is taken into consideration, therefore, the self-bias resistance Rf needs to take a very high value.

Japanese Patent Application Laid-Open No. 2004-096711 can be named as a prior art document concerned with the present invention.

The problems of the above-described earlier technology will be described by way of an inverting amplifier in a crystal oscillation circuit of 32 KHz as shown in FIG. 10. In this case, in order to ensure a large loop gain for the oscillator, the input impedance of the inverting amplifier is desired to be 10 MΩ or greater. Assuming that the gain Av of the inverting amplifier is 20, the value of the self-bias resistance Rf has to be set at 200 MΩ or greater in order to obtain an input impedance of 10 MΩ or more. If the value of the self-bias resistance Rf is set at 200 MΩ or higher, however, the following problems with practical use are posed:

1) If there is a slight current leakage or the like in an electrostatic protective circuit provided in an input or output terminal of the inverting amplifier, or in wiring connected to a device outside IC, such as a crystal resonator, the bias voltage of the inverting amplifier greatly varies, hindering an oscillatory action.

2) When the inverting amplifier is formed into IC, it is not easy to build a large resistance, such as 200 MΩ, into IC.

Next, VCXO (voltage-controlled crystal oscillator) as shown in FIG. 11 will be described. If a self-bias resistance Rf is high in this VCXO, bias voltage is apt to change in response to changes in control voltage VC. Namely, DC bias is unstable, so that the changes in the control voltage VC are easily transmitted to the input of the oscillator, and their influence appears as duty changes in the output waveform. If the self-bias resistance Rf is rendered low to avoid the duty changes, the input impedance of the inverting amplifier naturally lowers, arousing a decrease in the loop gain of the oscillator.

The present invention has been accomplished in the light of the above-mentioned problems with the prior art. It is an object of the present invention to provide an inverting amplifier, which can decrease a self-bias resistance without lowering the input impedance of the inverting amplifier, and a crystal oscillator having the inverting amplifier.

SUMMARY OF THE INVENTION

The features of the present invention, for attaining the above object, are characterized by the following;

1) An inverting amplifier, comprising: an inverter; a first self-bias resistance having one end connected to an input of the inverter; a second self-bias resistance connected to the other end of the first self-bias resistance and to an output of the inverter; and a bypass capacitance connected between a node and ground, the node lying between the first self-bias resistance and the second self-bias resistance.

2) The inverting amplifier according to 1), wherein the inverter is a CMOS inverter.

3) An inverting amplifier, comprising: a P-channel MOS transistor and an N-channel MOS transistor connected together in series; a capacitance connected between gates of the P-channel MOS transistor and the N-channel MOS transistor; a direct current bias circuit connected to the gate of one of the P-channel MOS transistor and the N-channel MOS transistor; a first self-bias resistance having one end connected to the gate of the other of the P-channel MOS transistor and the N-channel MOS transistor; a second self-bias resistance connected to the other end of the first self-bias resistance and to an output of an inverter; and a bypass capacitance connected between a node and ground, the node lying between the first self-bias resistance and the second self-bias resistance.

4) The inverting amplifier according to any one of 1) to 3), wherein the impedance of the bypass capacitance at the frequency of a signal to be amplified is smaller than a value obtained by dividing the value of the second self-bias resistance by the voltage gain of the inverting amplifier.

5) The inverting amplifier according to any one of 1) to 4), wherein the resistance value of the first self-bias resistance is higher than the resistance value of the second self-bias resistance.

6) The inverting amplifier according to any one of 1) to 5), wherein part or all of the first self-bias resistance and the second self-bias resistance has been replaced by an MOS transistor.

7) A crystal oscillator including the inverting amplifier according to any one of 1) to 6).

According to the present invention described above, an inverting amplifier having a high input impedance can be realized easily without using a high self-bias resistance. As a result; the oscillation margin of an oscillation circuit using the inverting amplifier can be rendered great, and the operating point of the circuit can be stabilized. Furthermore, it becomes easy to integrate the inverting amplifiers.

BRIEF DESCRIPTION OF THE DRAWINGS

For a more complete understanding of the present invention and the advantages thereof, reference is now made to the following descriptions in conjunction with the accompanying drawings.

DESCRIPTION OF THE PREFERRED EMBODIMENTS

Embodiments of the present invention will now be described in detail with reference to the accompanying drawings. The same portions as those in FIG. 8, and the same portions in the respective embodiments will be assigned the same numerals or symbols, with duplicate explanations being omitted.

Embodiment 1

Figure 1:
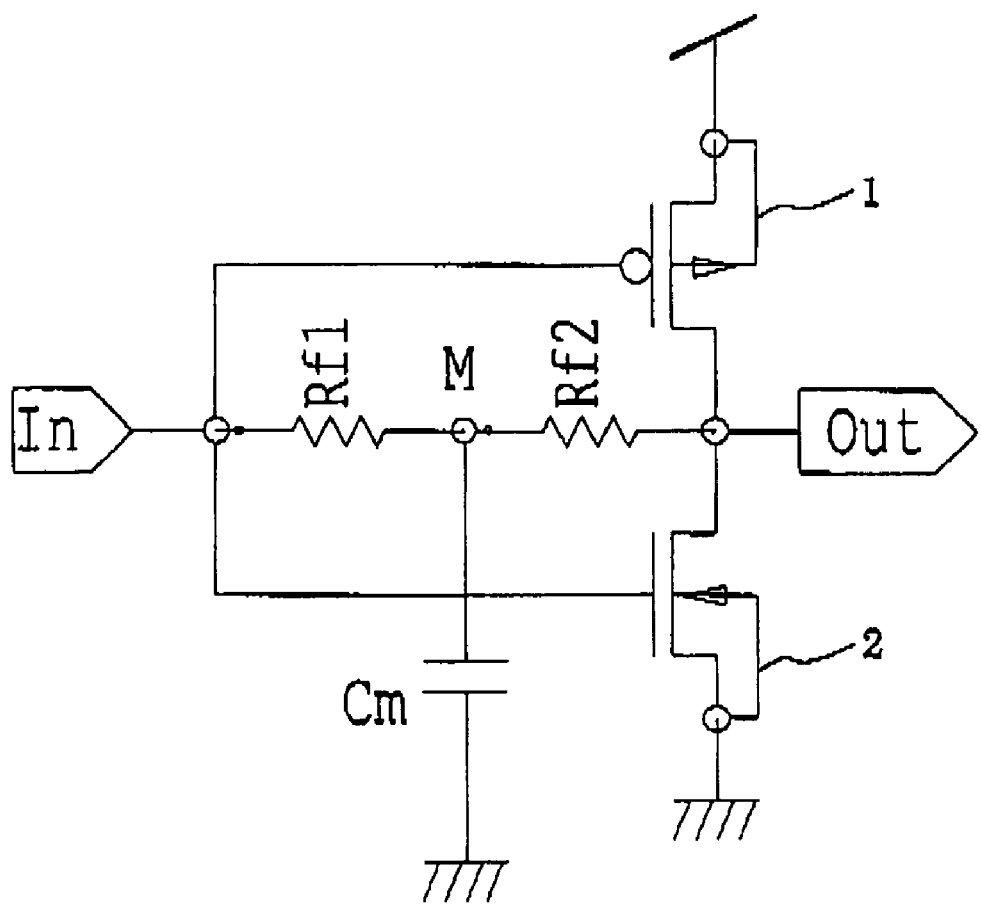
FIG. 1 is a circuit diagram showing an inverting amplifier according to Embodiment 1 of the present invention.

FIG. 1 is a circuit diagram showing an inverting amplifier according to Embodiment 1 of the present invention. As shown in this drawing, the inverting amplifier according to the present embodiment has a self-bias resistance connecting the input and the output of the amplifier, the self-bias resistance being divided into two, i.e., a first self-bias resistance Rf1 and a second self-bias resistance Rf2. A node M between the first self-bias resistance Rf1 and the second self-bias resistance Rf2 is grounded via a bypass capacitance Cm.

Figure 2:
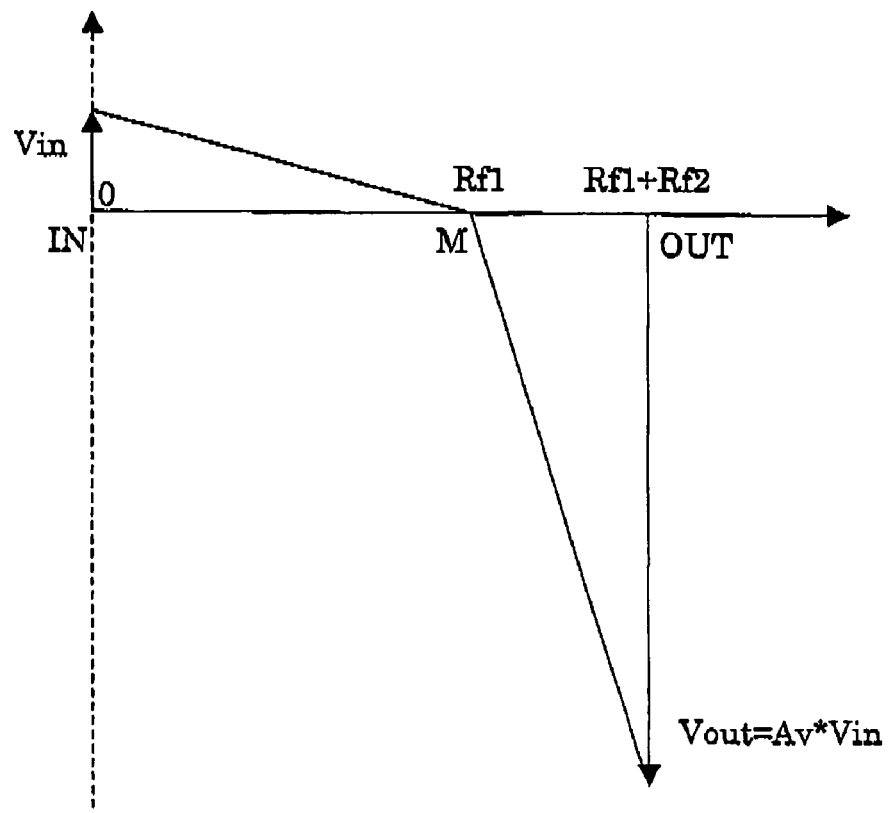
FIG. 2 is a view showing the input voltage and output voltage of the inverting amplifier shown in FIG. 1, and a voltage distribution along self-bias resistances.

To explain the principle of operation of this inverting amplifier, assume first that the bypass capacitance Cm is large enough so that there are almost no voltage changes at the node M. In this case, the voltage within the first self-bias resistance Rf1 and the second self-bias resistance Rf2 from an input terminal In up to an output terminal Out is as shown in FIG. 2. That is, the input impedance of the inverting amplifier is equal to Rf1, and is not dependent on the voltage gain of the inverter any more.

When the first self-bias resistance Rf1 is higher than the second self-bias resistance Rf2, the aforementioned effect is obtained practically if the capacitance Cm can fulfill:

$$1/(2\pi fCm) \leq Rf2/Av$$

Figure 3:
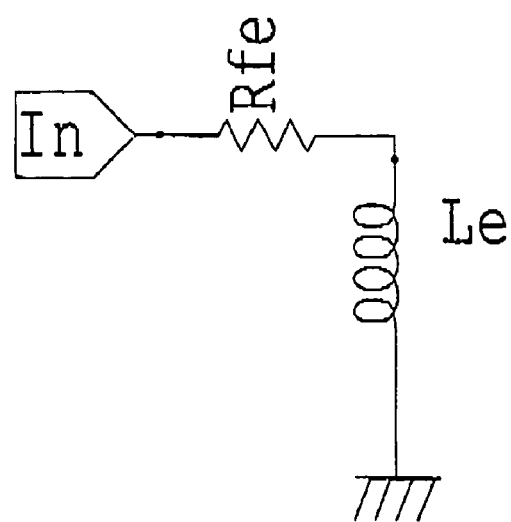
FIG. 3 is a circuit diagram showing an equivalent input impedance viewed from the input side of the inverting amplifier shown in FIG. 1.

Approximately, the input impedance in this case is expressed as a series circuit including Rfe and an inductance Le, as shown in FIG. 3, the absolute value |Zin| of the impedance being $$|Zin| > Rf1/\sqrt{2}$$

which is slightly lower than the first self-bias resistance Rf1.

A concrete example of the inverting amplifier according to the present embodiment will be shown here. If the input signal frequency f=32 KHz, the gain of the inverting amplifier Av=20, and the required input impedance |Zin|>10 MΩ, the following are recommendable:

$$Rf1 = 15\ M\Omega$$

$$Rf2 = 5\ M\Omega$$

$$Cm = 20\ pF$$

Here, it is easy to build a capacitance of the order of 20 pF into an IC chip. With the prior art, 200 MΩ or more has been required as the self-bias resistance Rf. Difficulty in constructing a resistance of 15 MΩ in the IC chip using a resistor element such as polysilicon can be resolved by replacing the resistor by an MOS transistor, as will be described later.

Embodiment 2

Figure 4:
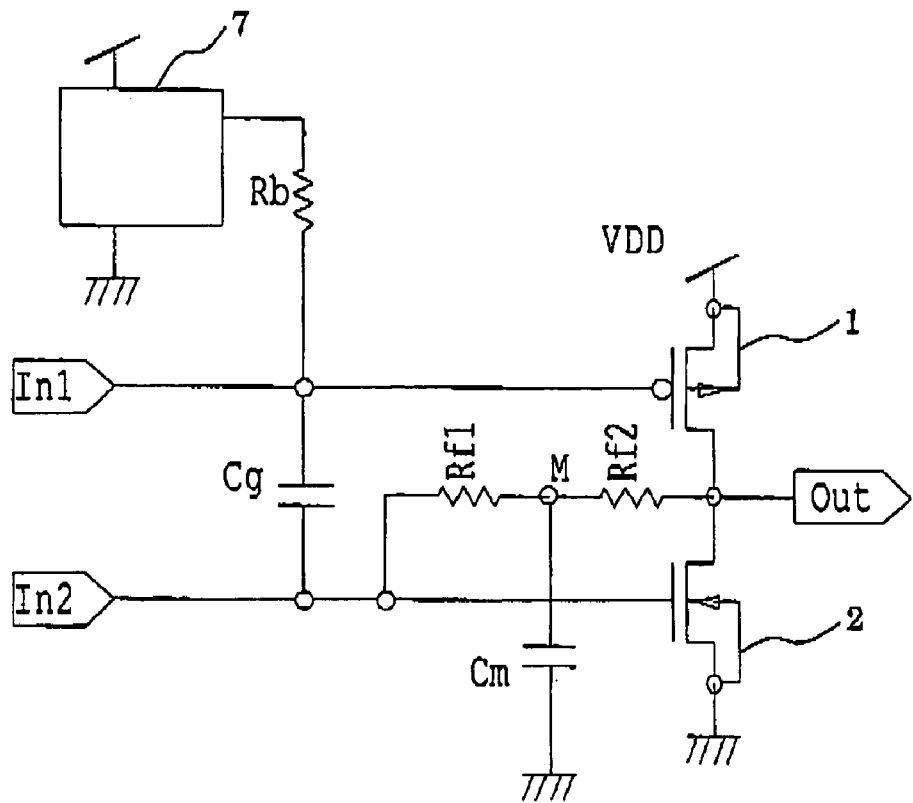
FIG. 4 is a circuit diagram showing an inverting amplifier according to Embodiment 2 of the present invention.

FIG. 4 is a circuit diagram showing an inverting amplifier according to Embodiment 2 of the present invention. As shown in this drawing, the inverting amplifier according to the present embodiment is designed to operate at a low voltage. For this purpose, the inverting amplifier has a capacitance Cg inserted between a gate of a P-channel MOS transistor 1 and a gate of an N-channel MOS transistor 2. Owing to this configuration separate bias can be applied to the respective gates, the P-channel MOS transistor 1 is biased by a voltage source 7 formed by a constant-voltage circuit, and the N-channel MOS transistor 2 is biased by a first self-bias resistance Rf1 and a second self-bias resistance Rf2. The principle of operation in the present embodiment is the same as that in Embodiment 1. Because of a capacitor Cm inserted between the first self-bias resistance Rf1 and the second self-bias resistance Rf2, an alternating current input impedance viewed from an input terminal In1 or an input terminal In2 is maintained at nearly the value of the parallel resistance of the first self-bias resistance Rf1 and a bias resistance Rb. The impedance of the capacitor Cg is set to be sufficiently small compared with the first self-bias resistance Rf1 or the bias resistance Rb.

Embodiment 3

Figure 5:
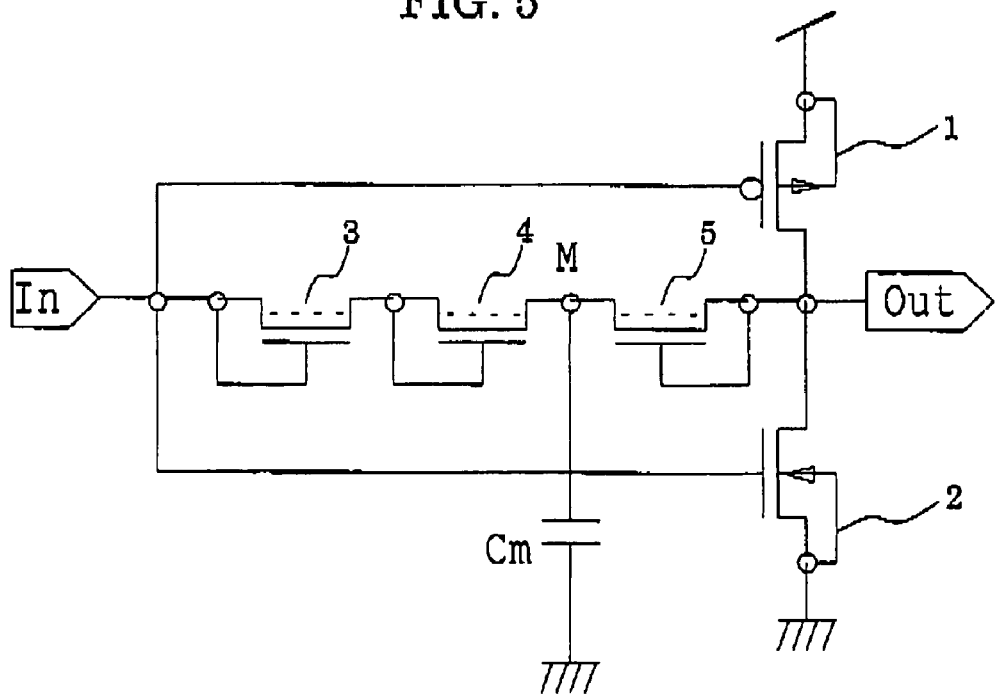
FIG. 5 is a circuit diagram showing an inverting amplifier according to Embodiment 3 of the present invention.

FIG. 5 is a circuit diagram showing an inverting amplifier according to Embodiment 3 of the present invention. As shown in this drawing, the inverting amplifier according to the present embodiment has depletion MOS transistors 3, 4 and 5 as replacements for the first self-bias resistance Rf1 and the second self-bias resistance Rf2 in Embodiment 1 (see FIG. 1). The use of the depletion MOS transistors 3, 4 and 5 makes it possible to create higher resistance in smaller areas than those of resistors composed of, for example, polysilicon.

Embodiment 4

Figure 6:
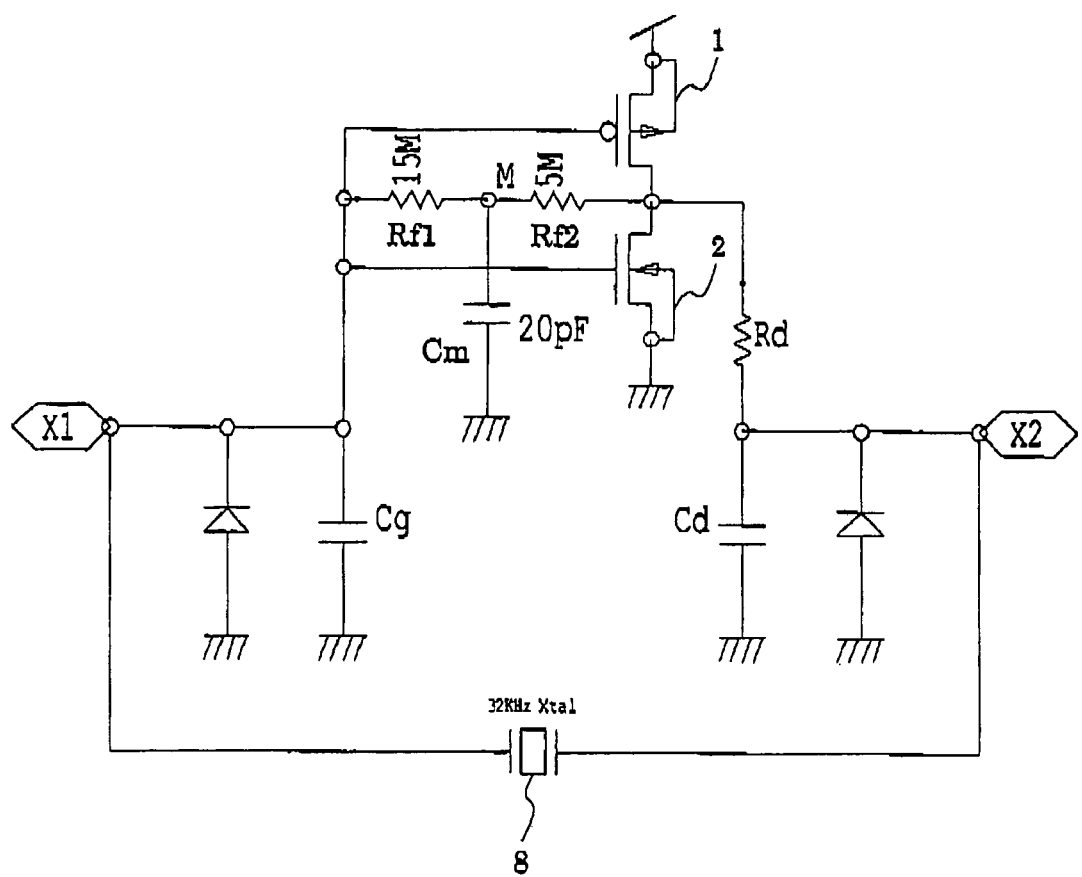
FIG. 6 is a circuit diagram showing a crystal oscillation circuit according to Embodiment 4 of the present invention.

FIG. 6 is a circuit diagram showing a crystal oscillation circuit of 32 kHz to which the inverting amplifier shown in FIG. 1 has been applied. As shown in this drawing, capacitances Cg and Cd connected to a crystal resonator 8 are each of the order of 10 pF, and their impedance is about 500 KΩ. Thus, the input impedance of the inverting amplifier is desired to be 20 times or more that of the impedance, namely, 10 MΩ or higher. The values of the first and second self-bias resistances Rf1 and Rf2, and the bypass capacitance Cm in the present embodiment are the same as those used in the concrete example of Embodiment 1. Thus, the input impedance of this inverting amplifier is 10 MΩ or higher. Moreover, the sum of the bias resistances is 20 MΩ, and with a bias resistor of such value, the direct current bias point will not be heavily influenced, even if a leakage current exists in the electrostatic protective diode.

Embodiment 5

Figure 7:
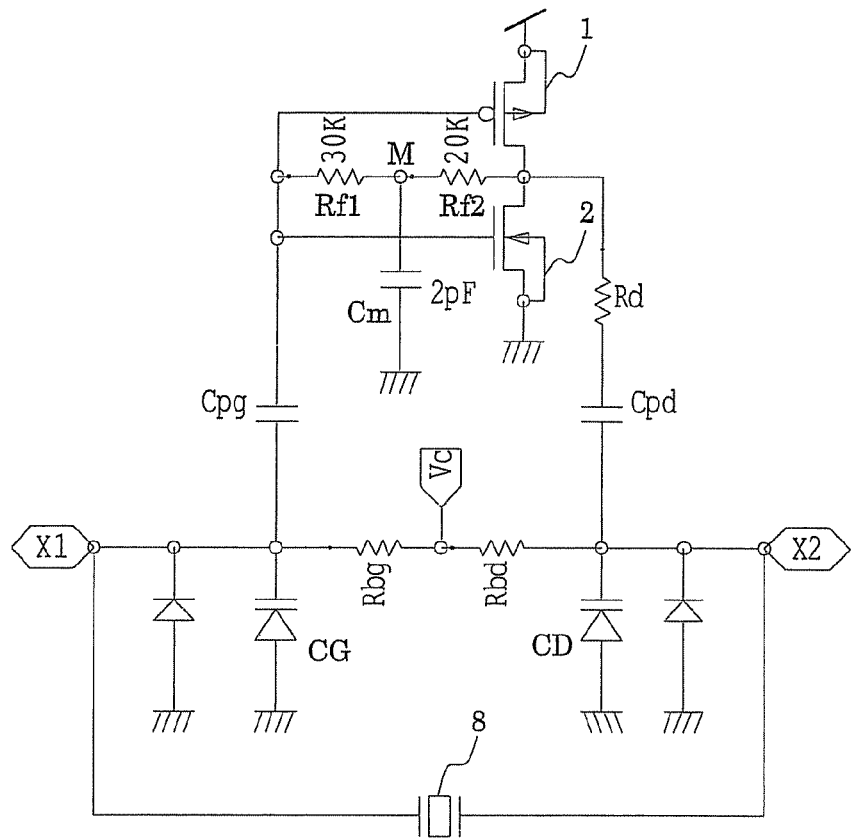
FIG. 7 is a circuit diagram showing a voltage-controlled crystal oscillation circuit according to Embodiment 5 of the present invention.

FIG. 7 is a circuit diagram showing a voltage-controlled crystal oscillation circuit of 32 MHz to which the inverting amplifier shown in FIG. 1 has been applied. In the present embodiment, the voltage gain Av of the inverter at 32 MHz is assumed to be around 5. The values of variable capacitances CG and CD vary within the range of 5 to 20 pF according to a voltage applied to a control voltage VC. In this case, the impedance of the variable capacitance CG takes a value of 250 to 1,000Ω. If, here, the input impedance of the inverting amplifier is desired to be at least 20 times higher than the impedance of the variable capacitance CG, the values of the first and second self-bias resistances Rf1 and Rf2 and the bypass capacitance Cm may be the values as shown in FIG. 7.

Figure 8:
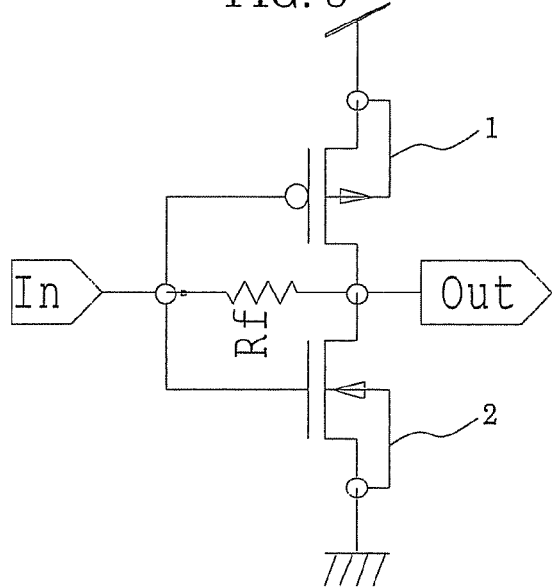
FIG. 8 is a circuit diagram showing a CMOS type inverting amplifier according to the prior art.
Figure 9:
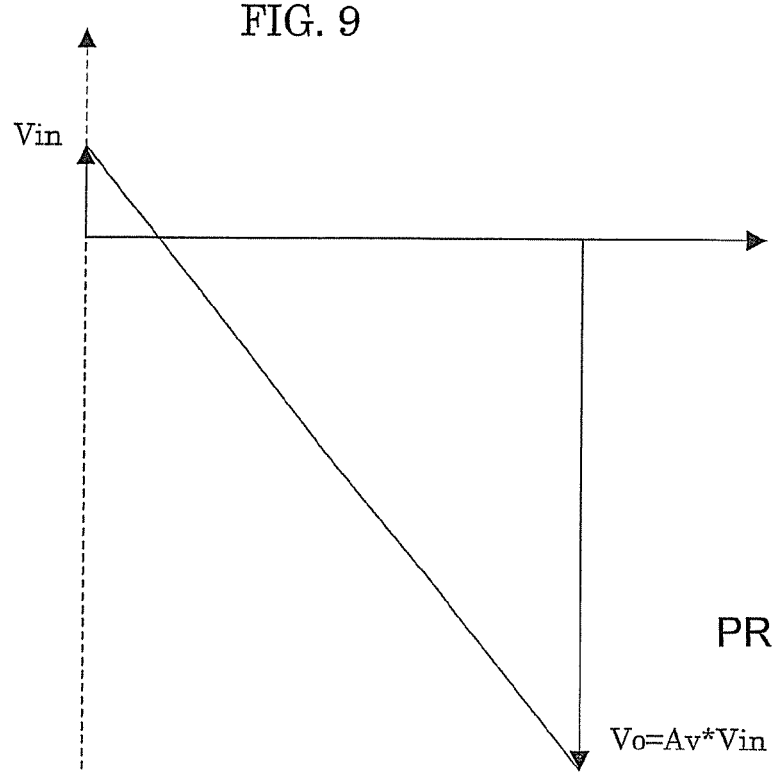
FIG. 9 is a characteristic view showing the input voltage and output voltage of the inverting amplifier shown in FIG. 8, and a voltage distribution along a self-bias resistance.
Figure 10:
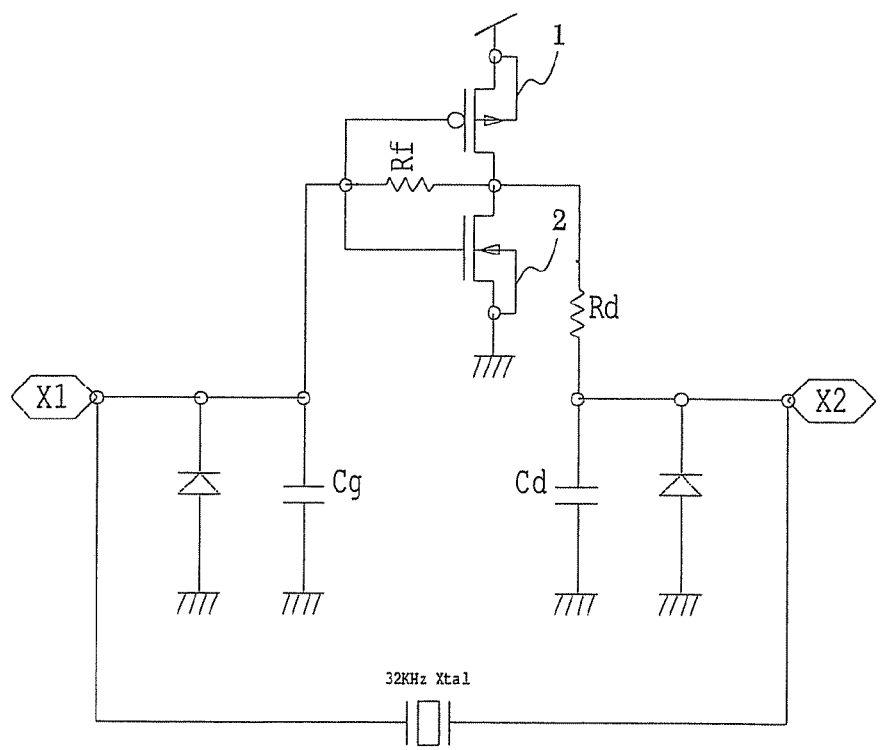
FIG. 10 is a circuit diagram showing an example in which the conventional inverting amplifier shown in FIG. 8 is applied to a crystal oscillation circuit of 32 KHz.
Figure 11:
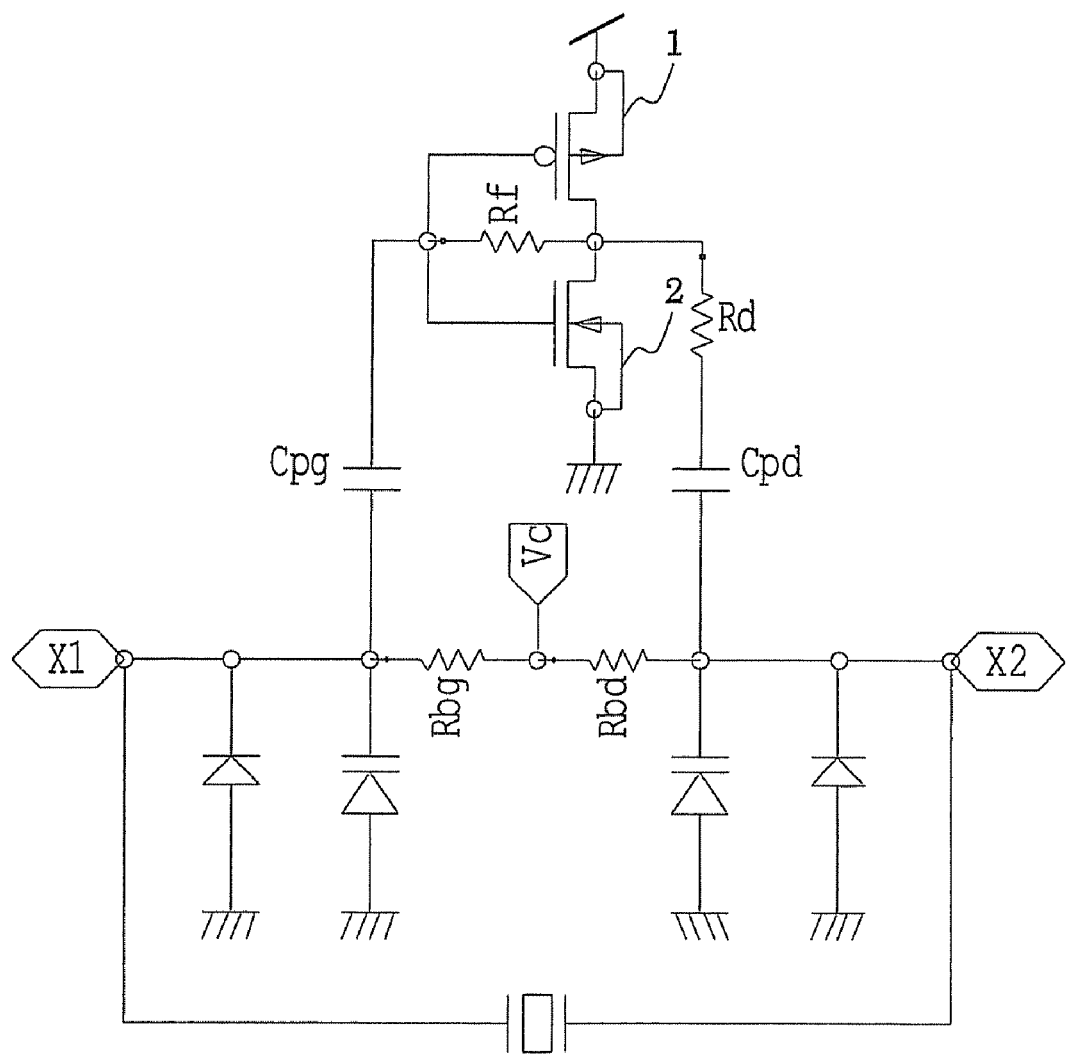
FIG. 11 is a circuit diagram showing an example in which the conventional inverting amplifier shown in FIG. 8 is applied to a voltage-controlled crystal oscillation circuit of 32 KHz.

If the inverting amplifier of FIG. 8 according to the prior art is used, a bias resistance of 120 KΩ is necessary for the input impedance of 20 KΩ or more. In the inverting amplifier of the present invention, therefore, changes in the bias voltage in response to changes in the control voltage VC are only a half or less of those in the prior art, That is, it becomes possible to realize a voltage-controlled crystal oscillation circuit with few duty changes in the output waveform, without deteriorating the characteristics of the oscillation circuit, such as oscillation margin.

The present invention can be utilized in industrial fields where electronic equipment such as a crystal oscillator is produced and sold.

The embodiments of the present invention have been described above, but the invention is not limited to these embodiments. It should be understood that the invention can be subject to changes, substitutions or alterations without departing from the spirit and scope of the invention as defined by the appended claims.

What is claimed is:

1. An inverting amplifier, comprising:
   an inverter;
   a first self-bias resistance having one end connected to an input of the inverter;
   a second self-bias resistance connected to another end of the first self-bias resistance and to an output of the inverter; and
   a bypass capacitance connected between a node and ground, the node lying between the first self-bias resistance and the second self-bias resistance.

2. An inverting amplifier, comprising:
   a CMOS inverter;
   a first self-bias resistance having one end connected to an input of the CMOS inverter;
   a second self-bias resistance connected to another end of the first self-bias resistance and to an output of the inverter; and
   a bypass capacitance connected between a node and ground, the node lying between the first self-bias resistance and the second self-bias resistance.

3. An inverting amplifier, comprising:
   a P-channel MOS transistor and an N-channel MOS transistor connected together in series;
   a capacitance connected between gates of the P-channel MOS transistor and the N-channel MOS transistor;
   a direct current bias circuit connected to the gate of one of the P-channel MOS transistor and the N-channel MOS transistor;
   a first self-bias resistance having one end connected to the gate of other of the P-channel MOS transistor and the N-channel MOS transistor;
   a second self-bias resistance connected to another end of the first self-bias resistance and to an output of an inverter; and
   a bypass capacitance connected between a node and ground, the node lying between the first self-bias resistance and the second self-bias resistance.

4. The inverting amplifier according to claim 1, wherein an impedance of the bypass capacitance at a frequency of a signal to be amplified is smaller than a value obtained by dividing a value of the second self-bias resistance by a voltage gain of the inverting amplifier.

5. The inverting amplifier according to claim 2, wherein an impedance of the bypass capacitance at a frequency of a signal to be amplified is smaller than a value obtained by dividing a value of the second self-bias resistance by a voltage gain of the inverting amplifier.

6. The inverting amplifier according to claim 3, wherein an impedance of the bypass capacitance at a frequency of a signal to be amplified is smaller than a value obtained by dividing a value of the second self-bias resistance by a voltage gain of the inverting amplifier.

7. The inverting amplifier according to claim 1, wherein a resistance value of the first self-bias resistance is higher than a resistance value of the second self-bias resistance.

8. The inverting amplifier according to claim 2, wherein a resistance value of the first self-bias resistance is higher than a resistance value of the second self-bias resistance.

9. The inverting amplifier according to claim 3, wherein a resistance value of the first self-bias resistance is higher than a resistance value of the second self-bias resistance.

10. The inverting amplifier according to claim 1, wherein part or all of the first self-bias resistance and the second self-bias resistance has been replaced by an MOS transistor.

11. The inverting amplifier according to claim 2, wherein part or all of the first self-bias resistance and the second self-bias resistance has been replaced by an MOS transistor.

12. The inverting amplifier according to claim 3, wherein part or all of the first self-bias resistance and the second self-bias resistance has been replaced by an MOS transistor.

13. A crystal oscillator including the inverting amplifier according to claim 1.

14. A crystal oscillator including the inverting amplifier according to claim 2.

15. A crystal oscillator including the inverting amplifier according to claim 3.

* * * * *